United States Patent
Leusink

(10) Patent No.: US 8,168,548 B2
(45) Date of Patent: May 1, 2012

(54) UV-ASSISTED DIELECTRIC FORMATION FOR DEVICES WITH STRAINED GERMANIUM-CONTAINING LAYERS

(75) Inventor: Gert Leusink, Saltpoint, NY (US)

(73) Assignee: Tokyo Electron Limited, Tokyo (JP)

( * ) Notice: Subject to any disclaimer, the term of this patent is extended or adjusted under 35 U.S.C. 154(b) by 668 days.

(21) Appl. No.: 11/529,353

(22) Filed: Sep. 29, 2006

(65) Prior Publication Data

US 2008/0078987 A1    Apr. 3, 2008

(51) Int. Cl.
*H01L 21/469* (2006.01)
(52) U.S. Cl. ........ 438/788; 438/792; 438/513; 438/771; 438/431; 257/E29.104
(58) Field of Classification Search .................. 438/788, 438/792, 513, 431, 770, 771; 257/E29.104
See application file for complete search history.

(56) References Cited

U.S. PATENT DOCUMENTS

| | | | |
|---|---|---|---|
| 6,014,685 A | 1/2000 | Marshall et al. | |
| 6,124,620 A * | 9/2000 | Gardner et al. | 257/411 |
| 6,706,643 B2 | 3/2004 | Tay et al. | |
| 2004/0164373 A1 * | 8/2004 | Koester et al. | 257/499 |
| 2005/0079691 A1 | 4/2005 | Kim et al. | |

FOREIGN PATENT DOCUMENTS

JP    07-268612    * 10/1995

OTHER PUBLICATIONS

Zhang et al. "Low temperature photo-oxidation of silicon using a xenon excimer lamp," App. Phys. Lett. 71, 2964, 1997.*
Bergonzo et al. "Low pressure photodeposition of silicon nitride films using xenon excimer lamp," App. Phys. Lett. 63, 1757, 1993.*
Boyd et al. "Vacuum-Ultra-Violet and Ozone Induced Oxidation of Silicon and Silicon-Germanium," Jpn. J. Appl. Phys 32, 6141-6146, 1993.*
Taiwanese Office Action and Search Report issued on Apr. 6, 2011 in corresponding Taiwanese Application No. 096134674 (with an English Translation).

* cited by examiner

*Primary Examiner* — Matthew Reames
(74) *Attorney, Agent, or Firm* — Oblon, Spivak, McClelland, Maier & Neustadt, L.L.P.

(57) ABSTRACT

A method of forming a semiconductor device includes providing a substrate in a vacuum processing tool, the substrate having a strained Ge-containing layer on the substrate and a Si-containing layer on the strained Ge-containing layer, maintaining the substrate at a temperature less than 700° C., and exposing the Si-containing layer to oxidation radicals in an UV-assisted oxidation process to form a Si-containing dielectric layer while minimizing oxidation and strain relaxation in the underlying strained Ge-containing layer. A semiconductor device containing a substrate, a strained Ge-containing layer on the substrate, and a Si-containing dielectric layer formed on the strained Ge-containing layer is provided. The semiconductor device can further contain a gate electrode layer on the Si-containing dielectric layer or a high-k layer on the Si-containing dielectric layer and a gate electrode layer on the high-k layer.

18 Claims, 6 Drawing Sheets

UV-ASSISTED DIELECTRIC FORMATION FOR DEVICES WITH STRAINED GERMANIUM-CONTAINING LAYERS

FIELD OF THE INVENTION

The present invention relates to semiconductor processing, and more particularly to forming semiconductor devices containing silicon-containing dielectric layers overlying strained germanium-containing layers.

BACKGROUND OF THE INVENTION

In semiconductor devices, strained germanium (s-Ge), strained silicon (s-Si), and strained silicon germanium (s-SiGe) layers are very promising as future transistor channel materials. Devices such as metal oxide semiconductor field effect transistors (MOSFETs) using strained substrates have been experimentally demonstrated to exhibit enhanced device performance compared to devices fabricated using conventional (unstrained) silicon substrates. Potential performance improvements include increased device drive current and transconductance, as well as the added ability to scale the operation voltage, without sacrificing circuit speed, in order to reduce power consumption.

In general, formation of strained layers is the result of strain induced in these layers when they are grown on a substrate formed of a crystalline material whose lattice constant is greater or smaller than that of the strained layers. The lattice constant of Ge is about 4.2 percent greater than that of Si, and the lattice constant of a SiGe alloy is linear with respect to its Ge concentration. In one example, the lattice constant of a SiGe alloy containing fifty atomic percent Ge is about 1.02 times greater than the lattice constant of Si.

Overlying the channel material in a MOSFET is a gate dielectric material, and a gate electrode material overlies the gate dielectric material. Current methods for forming dielectric layers, such as the gate dielectric material, typically require high temperature oxidation processes in order to achieve desired electrical properties. Currently, substrate temperatures above 700° C. are required, substrate temperatures of 800° C. or higher are typical. Alternatively, plasma oxidation may be used to form the dielectric layers at lower temperature. However, the present inventors have observed that the above conventional dielectric formation processes result in defects when applied to strained Ge-containing layers.

SUMMARY OF THE INVENTION

Accordingly, embodiments of the invention are directed to minimizing any of the above-described and/or other problems relating to methods and devices using strained Ge-containing layers.

These and/or other objectives may be achieved by embodiments of the invention, which provide a low temperature ultra-violet (UV) radiation exposure process for forming Si-containing dielectric layers such as $SiO_2$, SiON, or SiN dielectric layers for devices containing strained Ge-containing materials. The Ge-containing materials can include Ge and SiGe layers. The process uses UV radiation and a process gas containing an oxygen-, nitrogen-, or oxygen and nitrogen-containing gas, and substrate temperatures below 700° C. to form highly uniform and ultra thin Si-containing dielectric layers with excellent dielectric properties, while minimizing oxidation and strain relaxation in the underlying strained Ge-containing layer. The Si-containing dielectric layers can either be used alone as gate dielectric layers or as interfacial layers in combination with a high-k dielectric material in a device.

Thus, according to one embodiment of the invention, the method includes providing a substrate in a vacuum processing tool, the substrate having a strained Ge-containing layer on the substrate and a Si-containing layer on the strained Ge-containing layer, maintaining the substrate at a temperature less than 700° C., and exposing the Si-containing layer to oxidation radicals in an UV-assisted radical oxidation process to form a Si-containing dielectric layer while minimizing oxidation and strain relaxation in the underlying strained Ge-containing layer.

According to another embodiment of the invention, a semiconductor device is provided that includes a substrate, a strained Ge-containing layer on the substrate, a Si-containing dielectric layer formed on the strained Ge-containing layer, wherein the Si-containing dielectric layer is formed by exposing a Si-containing layer overlying the strained Ge-containing to oxidation radicals in an UV-assisted radical oxidation process to form a Si-containing dielectric layer at a substrate temperature less than 700° C. that minimizes oxidation and strain relaxation in the underlying strained Ge-containing layer. The semiconductor device can further contain a gate electrode layer on the Si-containing dielectric layer or a high-k layer on the Si-containing dielectric layer and a gate electrode layer on the high-k layer.

DETAILED DESCRIPTION OF SEVERAL EMBODIMENTS OF THE INVENTION

Figure 1A:
FIGS. 1A-1E schematically show cross-sectional device views corresponding to processing steps used in forming a semiconductor device containing a strained Ge-containing layer according to an embodiment of the invention.

As noted in the Background section above, the present inventors have observed that conventional dielectric forming techniques can form defects when applied to strained Ge-containing layers. In particular, conventional high substrate temperatures have been observed to result in defect formation due to at least partial strain relaxation in strained Ge-containing channel materials such as Ge and SiGe, and/or partial oxidation of the strained Ge-containing layer. Furthermore, since the dielectric layers can be only a few monolayers thick, the strained Ge-containing layers underneath the dielectric layers may be damaged by highly energetic plasma species during conventional plasma oxidation. Embodiments of the invention are directed to providing a low temperature dielectric-forming process that minimizes oxidation and strain relaxation in the strained Ge-containing layers, without conventional plasma damage to the underlying strained Ge layer.

Embodiments of the invention provide a method for forming high performance devices that contain an ultra thin Si-containing dielectric layer formed over a strained Ge-containing material. The Si-containing dielectric layer can, for example, either be used alone as a gate dielectric layer or as an interfacial layer in combination with a high-k dielectric material. According to one embodiment of the invention, the Si-containing dielectric layer can include a $SiO_2$ layer, a SiON layer, or a SiN layer, or a combination of two or more thereof.

In the figures described below, for ease of reference, common reference numerals are used throughout the figures when referring to the same or similar features common to the figures.

FIGS. 1A-1E schematically show cross-sectional device views corresponding to processing steps used in forming a semiconductor device containing a strained Ge-containing layer according to an embodiment of the invention. In FIG. 1A, the substrate (wafer) 100 can be of any size, for example a 200 mm substrate, a 300 mm substrate, or an even larger substrate. In one example, the substrate can be a n-type Si substrate. According to one embodiment of the invention, the substrate 100 may contain a SiGe buffer layer.

Figure 1B:
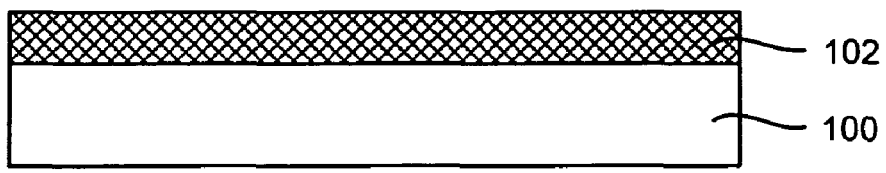

FIG. 1B shows a strained Ge-containing layer 102 formed over the substrate 100. The strained Ge-containing layer 102 can be a Ge layer, or a $Si_xGe_{1-x}$ layer where x is the atomic fraction of Si and 1−x is the atomic fraction of Ge. As used herein, "SiGe" refers to $Si_xGe_{1-x}$ alloys where $0.1 \leq 1-x<1$. Exemplary $Si_xGe_{1-x}$ alloys include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. The strained Ge-containing layer 102 can have, for example, a thickness between about 1 nm and about 20 nm, or between about 5 nm and about 10 nm. In one example, the strained Ge-containing layer 102 can be a compressive-strained Ge layer or a tensile-strained $Si_xGe_{1-x}$ (x>0.5) deposited on a relaxed $Si_{0.5}Ge_{0.5}$ buffer layer.

Figure 1C:
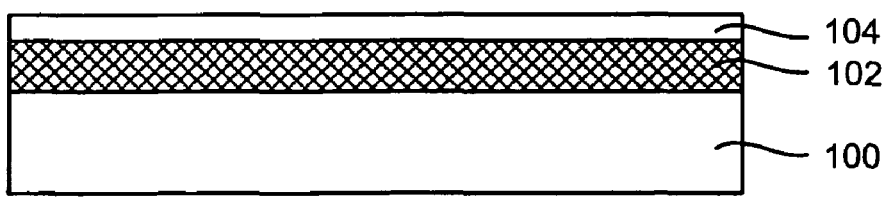

FIG. 1C shows a Si-containing layer 104 formed over the strained Ge-containing layer 102 on the substrate 100. The Si-containing layer 104 can, for example, have a thickness between about 0.3 nm and about 2 nm, or between about 0.5 nm and about 1 nm. The Si-containing layer 104 can contain a Si layer, a $SiO_2$ layer, a SiN layer, or a SiON layer, or a combination of two or more thereof. In one example, the Si-containing layer 104 can contain a $SiO_2$ layer overlying a Si layer. In another example, the Si-containing layer 104 can contain a SiN layer or a SiON layer overlying a Si layer. The Si layer can be crystalline, polycrystalline, or amorphous. According to one embodiment of the invention, the Si layer can be a tensile-strained Si layer.

Figure 1D:
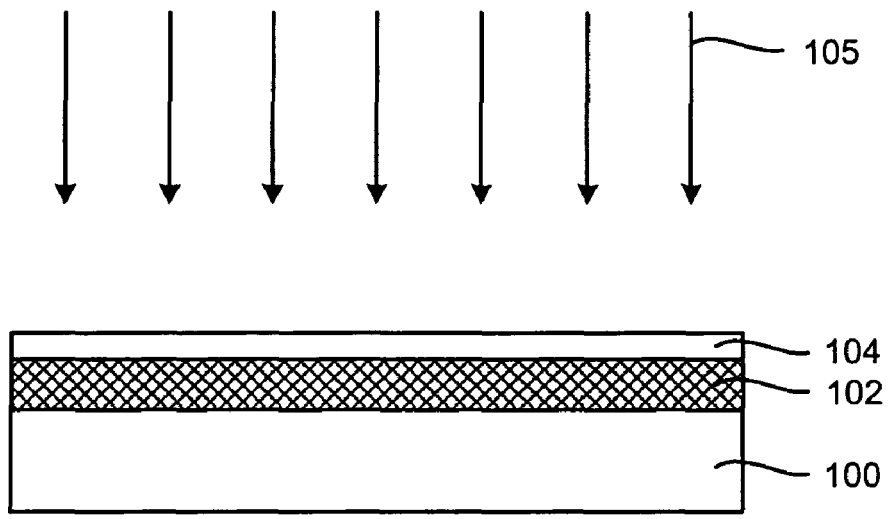
Figure 1E:
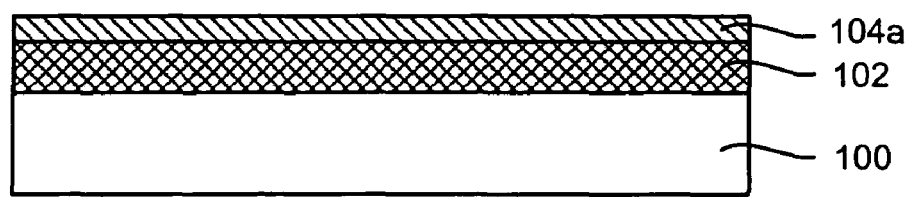

FIG. 1D shows the Si-containing layer 104 depicted in FIG. 1C exposed to UV radiation 105 and a process gas containing an oxygen-, nitrogen-, or oxygen and nitrogen-containing gas to form the Si-containing dielectric layer 104a by oxidation of the Si-containing layer 104 while maintaining the substrate 100 at a temperature less than 700° C. The UV radiation exposure may be performed by utilizing a processing system containing an UV radiation source as will be described with respect to FIG. 5 below. As used herein, oxidation of the Si-containing layer 104 refers to a chemical reaction between the Si-containing layer 104 and oxygen, nitrogen, or oxygen and nitrogen to incorporate oxygen, nitrogen, or both oxygen and nitrogen into the Si-containing layer 104. The oxidation can thus form a Si-containing dielectric layer 104a that includes a $SiO_2$ layer, a SiON layer, or a SiN layer. The UV-assisted oxidation process includes exposing the Si-containing layer 104 to oxidizing radicals that include oxygen radicals, nitrogen radicals, or both oxygen and nitrogen radicals, that are effective in forming a Si-containing dielectric layer 104a depicted in FIG. 1E without substantially oxidizing or relaxing the underlying strained Ge-containing layer 102. It is contemplated that the dielectric forming process may oxidize the entire vertical thickness of the Si-containing layer 104 but this is not required as partial oxidation of the entire vertical thickness of the Si-containing layer 104 may occur. Furthermore, as those skilled in the art will readily recognize, elemental composition throughout the formed Si-containing dielectric layer 104a may not be uniform but may instead have a vertical composition profile. In one example, different elements within the layer 104a may have different vertical composition profiles. The Si-containing dielectric layer 104a may have a thickness between about 0.3 nm and about 2 nm, or between about 0.5 nm and about 1 nm.

According to one embodiment of the invention, the Si-containing dielectric layer 104a, can contain an oxide layer containing Si and O, an oxynitride layer containing Si, O, and N, or a nitride layer containing Si and N. According to one embodiment of the invention, the Si-containing dielectric layer 104a can contain an oxide layer such as a $SiO_x$ layer where $x \leq 9$. In one example, the Si-containing dielectric layer 104a can contain $SiO_2$. In another example, the Si-containing dielectric layer 104a can contain a $SiO_x$ layer where $1<x<2$. According to another embodiment of the invention, the Si-containing dielectric layer 104a may contain an oxynitride layer such as a $SiO_xN_y$ layer. In one example, a composition of the $SiO_xN_y$ layer may include $0<x \leq 2$ and $0<y \leq 0.25$. According to yet another embodiment of the invention, the Si-containing dielectric layer 104a can contain a $Si_xN_y$ layer. A composition of the $Si_xN_y$ layer may include $x \leq 3$ and $y \leq 4$, for example a fully nitrided $Si_3N_4$ layer. In summary, the Si-containing dielectric layer 104a may contain a dielectric layer of $SiO_x$, $SiO_xN_y$, or $Si_xN_y$, or a combination of two or more thereof. As used herein, these dielectric layers are referred to as $SiO_2$, SiON, or SiN dielectric layers, respectively.

The choice between a $SiO_2$, SiON, or SiN dielectric layer in a device can depend on the electrical properties that are desired and materials compatibility with high-k materials. For example, $SiO_2$ dielectric layers are traditionally observed to have better electric properties than SiON dielectric layers, but SiON and SiN dielectric layers can be better diffusion barriers and can have a higher dielectric constant than $SiO_2$ dielectric layers, thereby increasing the overall dielectric constant of the gate stack, at the expense of reduced electron mobility in the device.

Figure 2A:
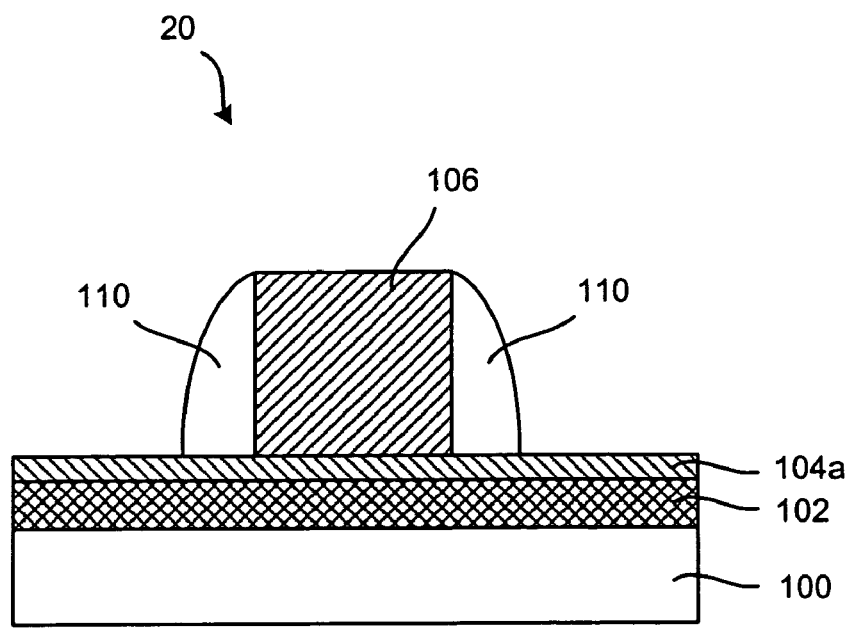
FIGS. 2A and 2B schematically show cross-sectional views of semiconductor devices containing a strained Ge-containing layer according to embodiments of the invention.
Figure 2B:
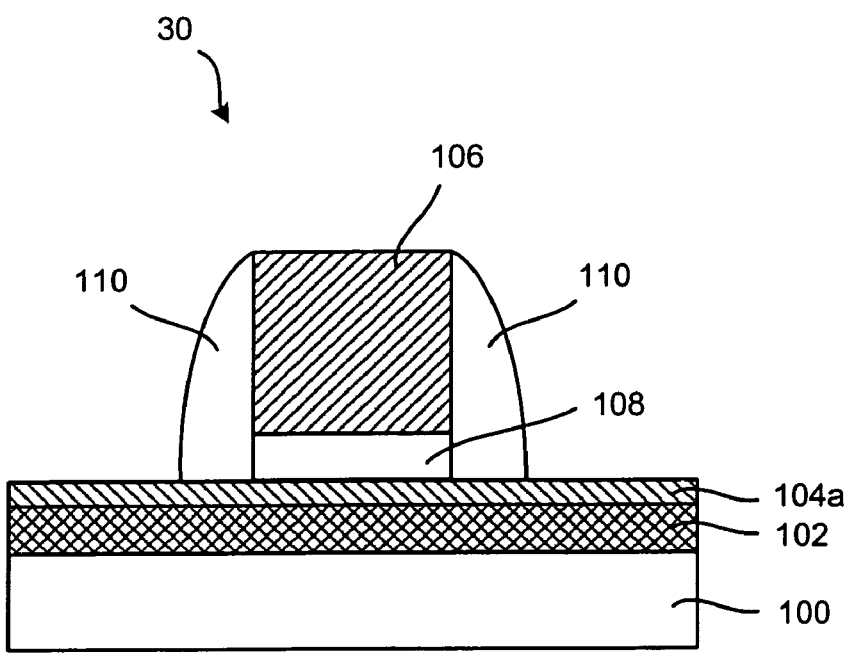

FIGS. 2A and 2B schematically show cross-sectional views of semiconductor devices containing a strained Ge-containing layer according to embodiments of the invention. In the schematic cross-sectional views in FIGS. 2A and 2B, source and drains regions of the MOSFETs 20, 30 are not shown. FIG. 2A shows a cross-sectional view of a MOSFET 20 containing a gate electrode layer 106 on the Si-containing dielectric layer 104a, and oxide spacer 110.

FIG. 2B shows a cross-sectional view of a MOSFET 30 containing a high-k dielectric layer 108 over the Si-containing dielectric layer 104a, a gate electrode layer 106 over the high-k layer 108, and oxide spacer 110. The high-k dielectric layer 108 can, for example, contain a metal oxide or a metal silicate, including $Ta_2O_5$, $TiO_2$, $ZrO_2$, $Al_2O_3$, $Y_2O_3$, $HfSiO_x$, $HfO_2$, $ZrO_2$, $ZrSiO_x$, $TaSiO_x$, $SrO_x$, $SrSiO_x$, $LaO_x$, $LaSiO_x$, $YO_x$, or $YSiO_x$, or combinations of two or more thereof. The thickness of the high-k dielectric layer 108 can, for example, be between about 2 nm and about 20 nm, and can be about 4 nm.

The gate electrode layer 106 can, for example, be about 10 nm thick and can contain poly-Si, a metal, or a metal-containing material, including W, WN, $WSi_x$, Al, Mo, Ta, TaN, TaSiN, HfN, HfSi, HfSiN, Ti, TiN, TiSiN, Mo, MoN, Re, Pt, or Ru.

Figure 3:
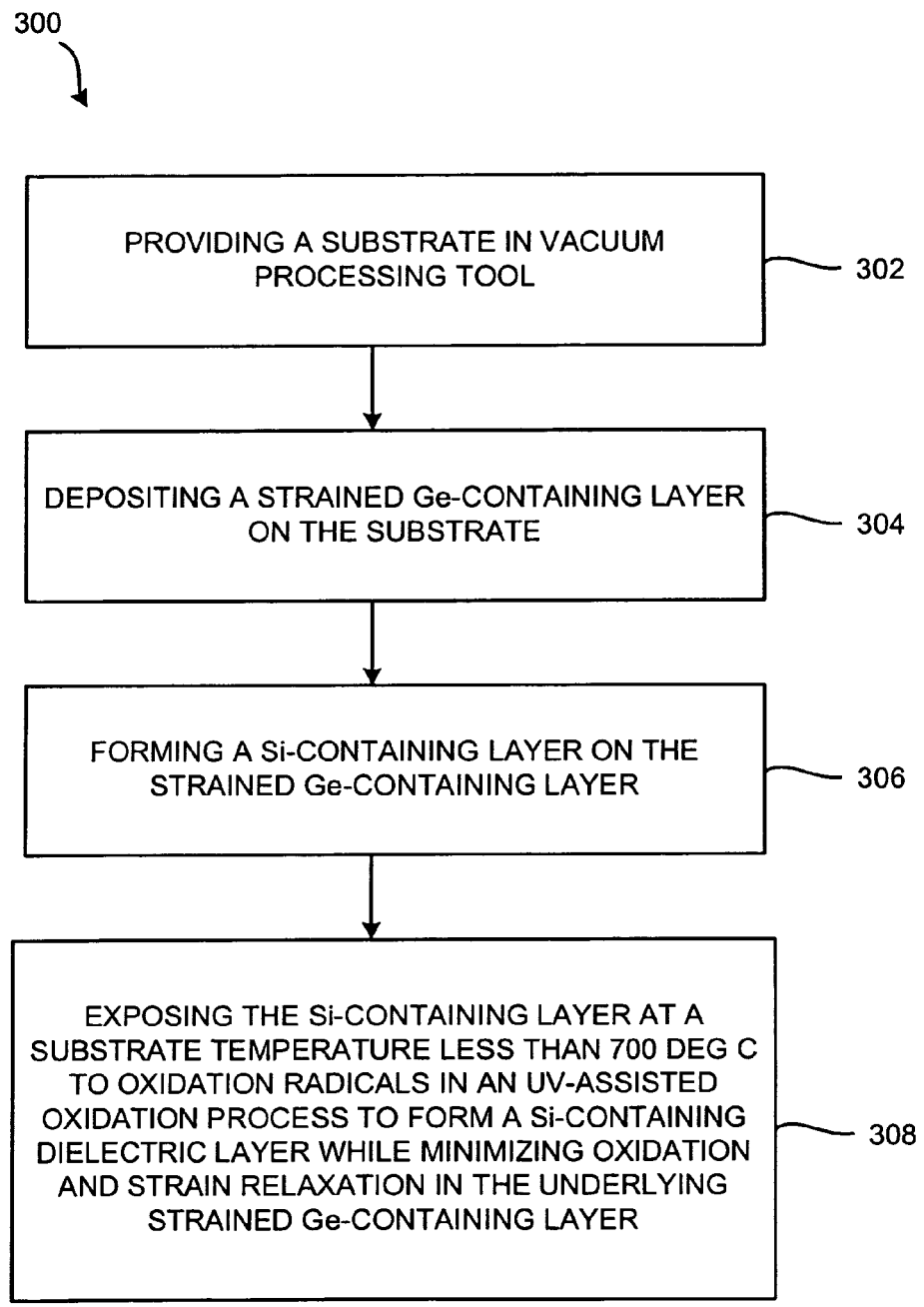
FIG. 3 is a process flow diagram for forming a semiconductor device containing a strained Ge-containing layer according to an embodiment of the invention.

FIG. 3 is a process flow diagram for forming a semiconductor device containing a strained Ge-containing layer according to an embodiment of the invention. Referring now to FIGS. 1 and 3, the process 300 includes, in step 302, providing a substrate 100 in a vacuum processing tool. According to one embodiment of the invention, the vacuum processing tool may be the vacuum processing tool 400 depicted in FIG. 4.

In step 304, a strained Ge-containing layer 102 is deposited onto the substrate 100. A strained SiGe layer 102 can, for example, be formed by chemical vapor deposition (CVD) using a reactant gas mixture containing a silicon-containing gas such as silane ($SiH_4$), disilane ($Si_2H_6$), chlorosilane ($SiClH_3$), dichlorosilane ($SiCl_2H_2$), trichlorosilane ($SiCl_3H$), or hexachlorodisilane ($Si_2Cl_6$), and a germanium-containing gas such as germane ($GeH_4$). A strained Ge layer 102 can, for example, be formed by CVD at a substrate temperature below 700° C. using a reactant gas containing $GeH_4$. Alternately, the strained Ge-containing layer 102 may be deposited by physical vapor deposition (PVD) methods such as sputtering.

In step 306, a Si-containing layer 104 is formed on the strained Ge-containing layer 102. The Si-containing layer 104 can, for example, be a Si layer formed by CVD at a substrate temperature below 700° C. using a reactant gas containing a silicon-containing gas such as or $Si_2Cl_6$.

The strained Ge-containing layer 102 and the Si-containing layer 104 can, for example, be deposited in a batch processing system configured to process about 100 substrates (wafers), or less. Alternately, a single wafer processing system may be utilized. The substrates can be of any size, for example 200 mm substrates, 300 mm substrates, or even larger substrates. Processing conditions used for depositing the strained Ge-containing layer 102 and the Si-containing layer 104 can include a process chamber pressure less than about 100 Torr. By way of example only, in a batch processing system, the chamber pressure can be less than about 1 Torr, for example about 0.3 Torr. By way of further example only, in a single wafer processing system, the chamber pressure can be in the range of about 1-20 Torr. Exemplary batch processing systems that may be utilized for depositing the strained Ge-containing layer 102 and the Si layer-containing layer 104 are described in U.S. Patent Application Publication No. 2005/0066892 A1, the entire content of which is herein incorporated by reference.

In step 308, the Si containing layer is exposed to a substrate temperature of less than 700° C. to oxidation radicals in a UV-assisted process, as will be further discussed below.

While steps 304 and 306 of FIG. 3 show deposition of the strained Ge-containing layer and forming of the Si layer, actual forming of these layers in the same vacuum processing tool that exposes the Si-containing layer 104 to UV radiation is not required for the present invention. However, forming these layers in the vacuum processing tool can minimize oxidation and contamination of these layers prior to exposure of the Si-containing layer 104 to the UV radiation and the process gas to form the Si-containing dielectric layer 104a. Further, one or both of the strained Ge-containing layer and Si-containing layer may be provided on the substrate prior to implementation of the present invention. That is, actual performance of steps 304 and 306 is not required to practice the present invention.

For example, according to one embodiment of the invention, a substrate containing a strained Ge-containing layer 102 on the substrate 100 may be provided into the vacuum processing tool. Thereafter, a Si-containing layer 104 is formed on the strained Ge-containing layer 102 (step 306), and the Si-containing layer 104 is exposed to UV radiation and a process gas containing an oxygen-, nitrogen-, or oxygen and nitrogen-containing gas to form the Si-containing dielectric layer 104a (step 308). In one example, any Ge-containing oxide formed on the strained Ge-containing layer 102 by transferring of the substrate through air to the vacuum processing tool, may be removed in the vacuum processing tool prior to forming the Si-containing layer 104 on the strained Ge-containing layer 102. In one example, since Ge-containing oxides can be volatile at moderate temperatures, removal of the Ge-containing oxide portion of the strained Ge-containing layer 102 may be performed by an annealing process.

According to yet another embodiment of the invention, a substrate 100 containing a strained Ge-containing layer 102 on the substrate 100 and a Si-containing layer 104 on the strained Ge-containing layer 102 may be provided into the vacuum processing tool. Thereafter, and the Si-containing layer 104 is exposed to UV radiation and a process gas containing an oxygen-, nitrogen-, or oxygen and nitrogen-containing gas to form the Si-containing dielectric layer 104a (step 308). In addition, any native oxide formed on the Si-containing layer 104 by transferring of the substrate through air to the vacuum processing tool may be removed prior to the exposure to UV radiation and a process gas. In one example, native oxide removal may be performed by a chemical oxide removal (COR) process where the native oxide layer is exposed to a treating gas comprising HF and $NH_3$ to form a chemically treated layer. Next, a desorption process is performed in order to remove the chemically treated layer. In another example, removal of any native oxide layer formed on the Si-containing layer 104 may be omitted prior to the exposure to the UV radiation.

Figure 5:
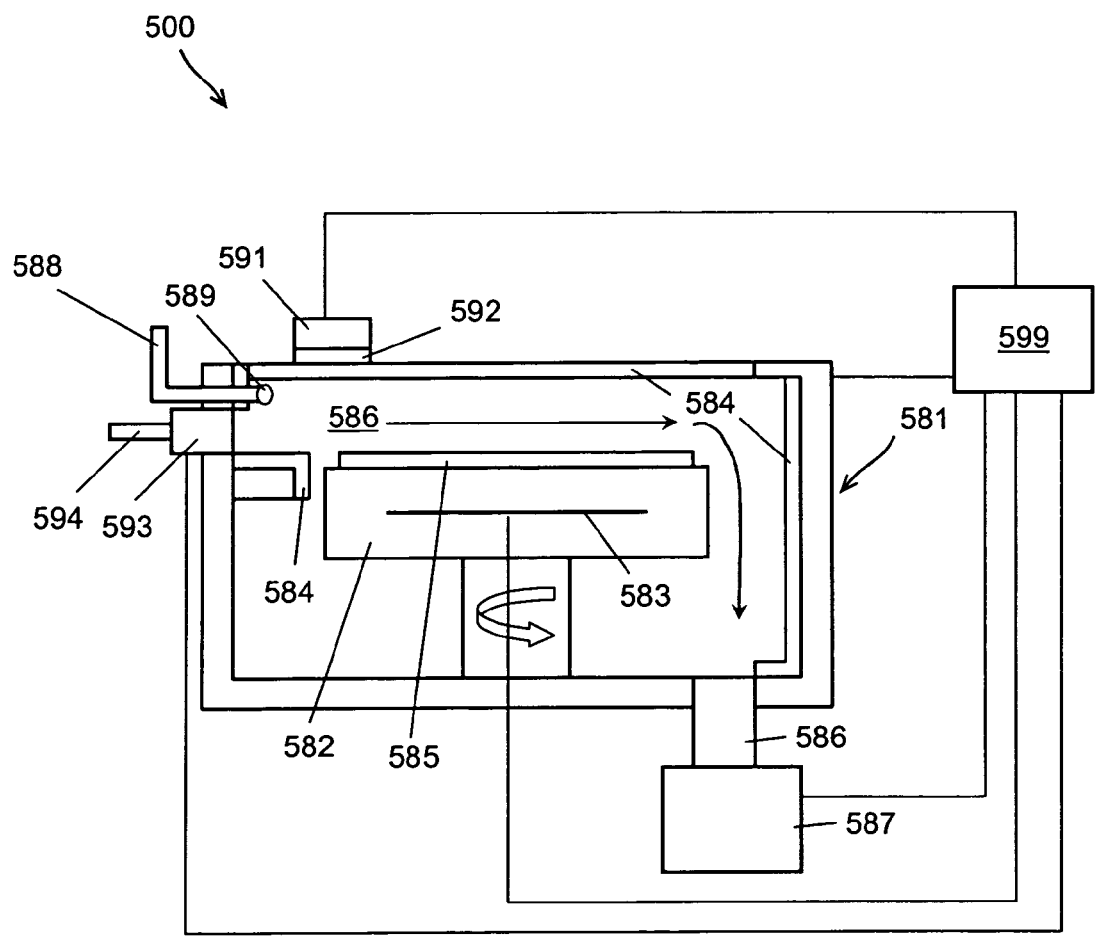
FIG. 5 is a simplified block-diagram of a processing system containing an ultra-violet (UV) radiation source for processing a semiconductor device according to embodiments of the invention.

As noted above, conventional high temperature oxidation processes can oxidize or relieve the strain of the Ge-containing layer, but lower temperature conventional plasma oxidation processes can damage the underlying Ge-containing layer. Such conventional oxidation plasmas are typically characterized by high electron temperature ($T_e$) and high plasma density or low electron temperature and low plasma density that requires long plasma exposure times. For example, U.S. patent application Ser. No. 11/393,737, the entire content of which is incorporated herein by reference, discloses a soft plasma dielectric forming process that can provide a dielectric with reduced damage, but may require plasma exposure times that are unacceptable for some processes. In step 308, the Si-containing layer 104 is exposed to UV radiation 105 in the presence of a process gas at a substrate temperature less than 700° C. The present inventors have recognized that such a process can provide time efficient oxidation (O, N, or O and N incorporation) of the Si-containing layer 104 while minimizing damage to the strained Ge-containing layer 102. The UV radiation exposure may be performed by a processing system containing an UV radiation source, such as described in FIG. 5. The processing system described in FIG. 5 is characterized by generation of low energy oxygen and/or nitrogen radicals that enable substantially damage-free oxidation of the Si-containing layer 104 overlying the strained Ge-containing layer 102. Further, the UV oxidation process avoids or minimizes oxidation and strain relaxation in the underlying strained Ge-containing layer 102.

According to one embodiment of the invention, the Si-containing layer 104 is oxidized to form an oxide layer ($SiO_2$) from a process gas containing $O_2$ or $H_2O$ and an inert gas such as Ar, Kr, He, or Xe. A flow rate of the $O_2$ or $H_2O$ gas can be between 10 sccm and 500 sccm, and a flow rate of the inert gas can be between 500 sccm and 2000 sccm. The gas pressure in the process chamber can be between 20 mTorr and 200 mTorr. The substrate can be maintained at a temperature less than 700° C., for example between room temperature and less than 700° C., or between about 200° C. and about 500° C. In one example, the substrate can be maintained at a temperature of about 500° C.

According to another embodiment of the invention, the Si-containing layer 104 is oxidized to form an oxynitride layer (SiON) from a process gas containing $N_2$, $O_2$, and optionally an inert gas such as Ar, Kr, He, or Xe. A flow rate of the $O_2$ gas and the $N_2$ gas can be between 10 sccm and 500 sccm, and a flow rate of the inert gas can be between 500 sccm and 2000 sccm. The gas pressure in the process chamber can be between 20 mTorr and 2000 mTorr. The substrate can be maintained at a temperature less than 700° C., for example between room temperature and less than 700° C., or between about 200° C. and about 500° C. In one example the substrate can be maintained at a temperature of about 500° C. According to another embodiment of the invention, the process gas may contain NO, $NO_2$, or $N_2O$, or a combination thereof, and optionally an inert gas.

According to still another embodiment of the invention, the Si-containing layer 104 is oxidized to form a nitride layer (SiN) from a UV excited process gas containing $N_2$ or $NH_3$ and optionally an inert gas such as Ar, Kr, He, or Xe. A flow rate of the $N_2$ gas can be between 10 sccm and 500 sccm, and a flow rate of the inert gas can be between 500 sccm and 2000 sccm. The gas pressure in the process chamber can be between 20 mTorr and 2000 mTorr. The substrate can be maintained at a temperature less than 700° C., for example between room temperature and less than 700° C., or between about 200° C. and about 500° C. In one example the substrate can be maintained at a temperature of about 500° C.

According to yet another embodiment of the invention, the Si-containing layer 104 is oxidized to form an oxynitride layer (SiON) in a sequential UV-assisted oxidation process. For example, a $SiO_2$ layer may be first formed by exposing the Si-containing layer 104 to UV radiation and a first process gas containing $O_2$ or $H_2O$, followed by exposure of the $SiO_2$ layer to UV radiation and a second process gas containing $N_2$ or $NH_3$. According to another embodiment of the invention, a SiN layer may be first formed by exposure of the Si-containing layer 104 to UV radiation and a first process gas containing $N_2$ or $NH_3$, followed by exposure of the SiN layer to a UV radiation and a second process gas containing $O_2$ or $H_2O$. The two step process may be performed in the same processing system to minimize substrate contamination and increase throughput or, alternately, the two step process may be performed in different processing systems each configured for performing one of the two steps. The processing conditions described above for forming oxide and nitride layers may be utilized for performing the two step process for forming the oxynitride layer.

Figure 4:
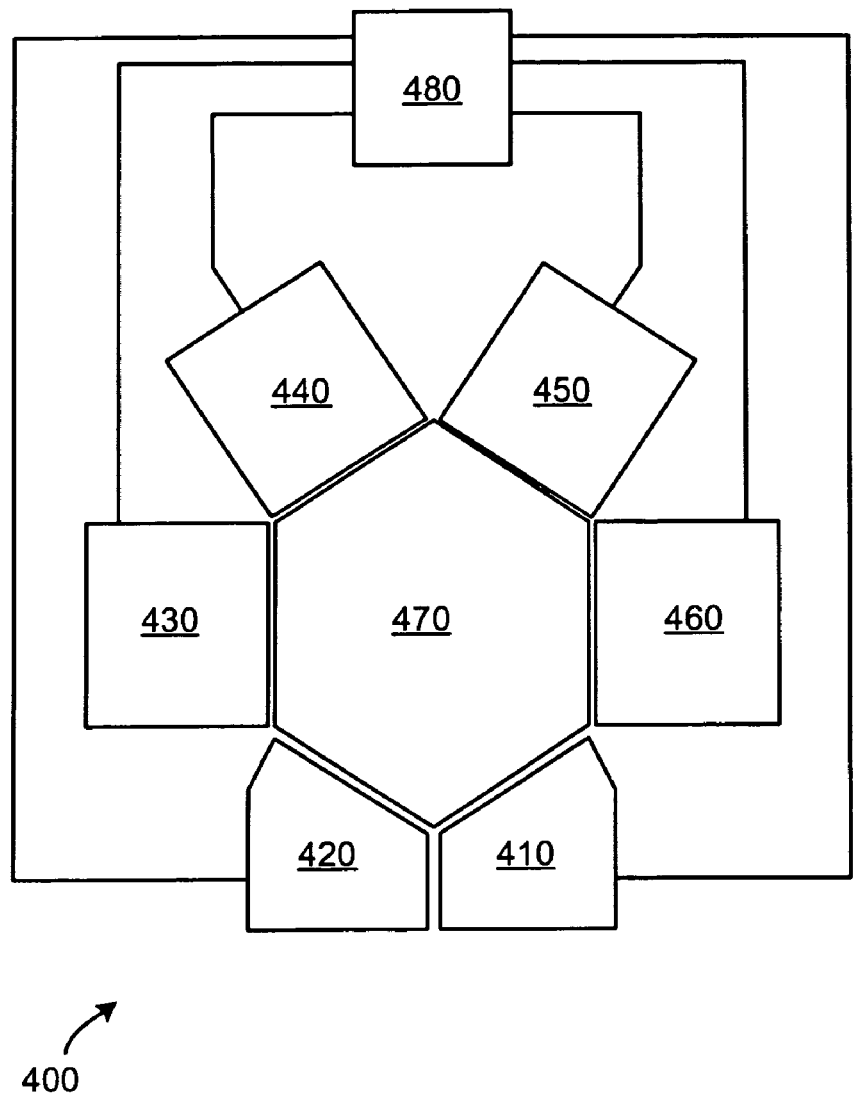
FIG. 4 schematically shows a vacuum processing tool for forming a semiconductor device according to an embodiment of the invention.

FIG. 4 schematically shows a vacuum processing tool for forming a semiconductor device according to an embodiment of the invention. The vacuum processing tool 400 contains substrate loading chambers 410 and 420, processing systems 430-460, robotic transfer system 470, and controller 480.

The substrate loading chambers 410 and 420 are utilized for transferring substrates into the vacuum processing tool 400 for processing, and out of the vacuum processing tool 400 following processing. Since the vacuum processing tool 400 is normally under vacuum, the substrate loading chambers 410 and 420 are configured to evacuate substrates disposed in the vacuum processing tool 400. As shown in FIG. 4, the substrate loading chambers 410 and 420 are coupled to the robotic transfer system 470. The robotic transfer system 470 is configured for transferring substrates between the substrate loading chambers 410 and 420 and the processing systems 430-460. The robotic transfer system 470 can, for example, be purged with an inert gas such as Ar under vacuum conditions (e.g., about 100 m Torr or less).

The processing system 430 can be configured for degassing and/or pre-cleaning. Degassing may be carried out following evacuation when the patterned substrate is disposed in the vacuum processing tool 400. The degassing can, for example, be performed by heating the substrate to a temperature between about 100° C. and about 500° C. in the presence of an inert gas such as Ar. Pre-cleaning may include light plasma cleaning of the substrate to remove any native oxide or other impurities from the surface of the substrate. According to one embodiment, the processing system 430 may be configured for removing an oxide layer from the surface of the substrate using chemical oxide removal (COR) processing.

The processing system 440 can be configured for depositing a strained Ge-containing layer (e.g., Ge or SiGe) on the substrate by chemical vapor deposition (CVD), plasma assisted vapor deposition (PVD), or atomic layer deposition (ALD). Furthermore, the processing system 440 may be configured for depositing a SiGe buffer layer on the substrate prior to depositing the strained Ge-containing layer. A SiGe buffer layer can be a thick relaxed SiGe layer. The processing system 450 can be configured for forming a Si-containing layer on the strained Ge-containing layer. Alternately, the processing system 440 may be configured for depositing the strained Ge-containing layer and the Si-containing layer. The processing system 460 is configured for forming the Si-containing dielectric layer by exposing the Si-containing layer to UV radiation and a process gas. According to one embodiment of the invention, the processing system 460 can be the processing system 500 depicted and described in FIG. 5. Although not shown, the vacuum processing tool 400 may also contain a substrate aligning system and a cool-down system configured for cooling processed substrates.

Following degassing and/or pre-cleaning in the processing system 430, the substrate is transported by the robotic transfer system 470 to the processing system 440 for depositing a strained Ge-containing layer. Next, the substrate is transported by the robotic transfer system 470 to the processing system 450 for depositing a Si-containing layer onto the strained Ge-containing layer. Next, the substrate is transported by the robotic transfer system 470 to the processing system 460 for exposing the Si-containing layer to UV radiation and a process gas. Thus, the vacuum processing tool 400 allows for performing the processing steps 302-308 of FIG. 3 without exposure to air during and between the steps 302-308. This enables formation of clean material layers with good control over interfaces between the different layers. Although not shown, the processing tool 400 may contain or be in vacuum connection with additional processing systems for further processing of the substrate following the process in step 308. For example, one or more processing systems may be configured for depositing a high-k layer on the Si-containing dielectric layer, annealing the high-k stack following deposition of the high-k layer, or depositing a gate electrode layer on the high-k layer.

According to one embodiment, the Si-containing layer 104 may contain a low density chemical oxide layer ($SiO_x$) that is formed by wet oxidation of a Si layer. The low density chemical oxide layer may subsequently be densified by exposure to UV radiation and a process gas to form a Si-containing dielectric layer 104a. The Si-containing dielectric layer 104a can contain $SiO_2$, or SiON, or a combination thereof.

The vacuum processing tool 400 can be controlled by a controller 480. The controller 480 can be coupled to and exchange information with substrate loading chambers 410 and 420, processing systems 430-460, and robotic transfer system 470. The controller 480 can operate substrate transfer operations within the vacuum processing tool 400 and substrate processing performed within the processing systems 430-460. In one embodiment of the invention, the controller 480 can be programmed through a program stored in the memory of the controller 480 to perform processes of embodiments of the invention and any functions associated with monitoring the processes. The controller 480 may be a systems controller, a dedicated hardware circuit, a programmed general purpose computer, such as a DELL PRECISION WORKSTATION 610™, available from Dell Corporation, Austin, Tex.

FIG. 5 is a simplified block-diagram of a processing system containing an UV radiation source for processing a semiconductor device according to embodiments of the invention. The processing system 500 includes a process chamber 581 accommodating therein a substrate holder 582 equipped with a heater 583 that can be a resistive heater. Alternately, the heater 583 may be a lamp heater or any other type of heater. Furthermore the process chamber 581 contains an exhaust line 586 connected to the bottom portion of the process chamber 581 and to a vacuum pump 587. The substrate holder 582 can be rotated by a drive mechanism (not shown). The process chamber 581 contains a process space 586 above the substrate 585. The inner surface of the process chamber 581 contains an inner liner 584 made of quartz in order to suppress metal contamination of the substrate 585 to be processed.

The process chamber 581 contains a gas line 588 with a nozzle 589 located opposite the exhaust line 586 for flowing a process gas over the substrate 585. The process gas flows over the substrate 585 in a processing space 586 and is evacuated from the process chamber 581 by the exhaust line 586.

The process gas supplied from the nozzle 589 is activated by UV radiation generated by an UV radiation source 591 emitting UV radiation through a UV transmissive window 592 (e.g., quartz) into the processing space 586 between the nozzle 589 and the substrate 585. The UV radiation forms oxidation radicals in the processing space 586 that flow along the surface of the substrate 585, thereby exposing the substrate 585 to the oxidation radicals. The oxidation radicals include O and/or N atoms. The UV radiation source 591 is configured to generate UV radiation capable of dissociating an oxygen-, nitrogen-, or oxygen and nitrogen-containing gas to form the oxidation radicals. Unlike during plasma processing, substantially no ions are formed in the processing space 586 by the UV radiation. Commonly, UV radiation is referred to as having wavelengths between about 5 nm and about 400 nm. According to one embodiment of the invention, the UV radiation source 591 is configured to generate UV radiation with a wavelength of 172 nm.

Furthermore, the process chamber 581 contains a remote plasma source 593 located opposite the exhaust line 586. The remote plasma source 593 may be utilized to form neutral and ionized plasma-excited species that may assist in the UV-assisted oxidation process described above. A process gas containing oxygen-, nitrogen-, or oxygen and nitrogen-containing gas can be supplied by gas line 594 to the remote plasma source 593 for forming the plasma-excited oxidation species. The plasma-excited oxidation species flow from the remote plasma source 593 along the surface of the substrate 585, thereby exposing the substrate to the plasma-excited oxidation species.

According to one embodiment of the invention, in addition to exposing the substrate 585 to oxidation radicals generated by the UV radiation source 591, the substrate may be exposed to plasma-excited oxidation species generated by the remote plasma source 593.

Still referring to FIG. 5, a controller 599 includes a microprocessor, a memory, and a digital I/O port capable of generating control voltages sufficient to communicate and activate inputs of the processing system 500 as well as monitor outputs from the processing system 500. Moreover, the controller 599 is coupled to and exchanges information with process chamber 581, the pump 587, the heater 583, the remote plasma source 593, and the UV radiation source 591. As with the controller 499 in FIG. 4, the controller 599 may be implemented as a UNIX-based workstation. Alternately, the controller 599 can be implemented as a general-purpose computer, digital signal processing system, etc.

Further details of a processing system containing an UV radiation source is described in copending European Patent Application EP1453083A1, titled "NITRIDING METHOD FOR INSULATION FILM, SEMICONDUCTOR DEVICE AND PRODUCTION METHOD FOR SEMICONDUCTOR DEVICE, SUBSTRATE TREATING DEVICE AND SUBSTRATE TREATING METHOD", the entire contents of which is hereby incorporated by reference.

It should be understood that various modifications and variations of the present invention may be employed in practicing the invention. It is therefore to be understood that, within the scope of the appended claims, the invention may be practiced otherwise than as specifically described herein.

What is claimed is:

1. A method of forming a semiconductor device, comprising:
    providing a substrate in a processing chamber of a vacuum processing tool, the processing chamber being pressure-controlled to induce a vacuum, the substrate having a strained Ge-containing layer on the substrate and a Si-containing layer on the strained Ge-containing layer;
    maintaining the substrate at a temperature less than 700° C.;
    introducing a process gas through a nozzle into the processing chamber;
    exposing the process gas to ultra-violet radiation to form oxidation radicals by dissociating the process gas, the ultra-violet radiation being radiated into a region between the nozzle and the substrate by a UV source located outside the vacuum; and
    exposing the Si-containing layer to the oxidation radicals to form a Si-containing dielectric layer while minimizing oxidation and strain relaxation in the underlying strained Ge-containing layer,
    wherein substantially no ions are formed in the processing tool during exposure to the ultra-violet radiation.

2. The method according to claim 1, wherein the Si-containing layer comprises a Si layer, a $SiO_2$ layer, a SiN layer, or a SiON layer, or a combination of two or more thereof.

3. The method according to claim 1, wherein only a portion of the Si-containing layer is exposed to the ultra-violet radiation and the process gas contains an oxygen, nitrogen, or oxygen and nitrogen-containing gas.

4. The method according to claim 3, wherein the process gas comprises $O_2$, $H_2O$, $N_2$, $NH_3$, NO, $NO_2$, or $N_2O$, or a combination of two or more thereof.

5. The method according to claim 3, wherein the portion of the Si-containing layer is exposed to the ultra-violet radiation via a window transmissive to the ultra-violet radiation arranged between the ultra-violet source and the process chamber.

6. The method according to claim 3, wherein the ultra-violet radiation is generated at a wavelength of 172 nm.

7. The method according to claim 1, wherein the Si-containing dielectric layer comprises a $SiO_2$ layer, a SiON layer, or a SiN layer, or a combination of two or more thereof.

8. The method according to claim 1, wherein the Si-containing layer comprises a low density $SiO_x$ layer and the formed Si-containing dielectric layer comprises a $SiO_2$ layer, a SiON layer, or a combination thereof.

9. The method according to claim 7, wherein the Si-containing layer has a thickness between about 0.3 nm and about 2 nm and the formed Si-containing dielectric layer has a thickness between about 0.3 nm and about 2 nm.

10. The method according to claim 7, wherein the Si-containing layer has a thickness between about 0.5 nm and about 1 nm and the formed Si-containing dielectric layer has a thickness between about 0.5 nm and about 1 nm.

11. The method according to claim 1, wherein the exposing of the Si-containing layer comprises:
exposing the Si-containing layer to the ultra-violet radiation and a first process gas comprising $O_2$ or $H_2O$; and
thereafter, exposing the Si-containing layer to the ultra-violet radiation and a second process gas comprising $N_2$ or $NH_3$.

12. The method according to claim 1, wherein the exposing of the Si-containing layer comprises:
exposing the Si-containing layer to the ultra-violet radiation and a first process gas comprising $N_2$ or $NH_3$; and
thereafter, exposing the Si-containing layer to the ultra-violet radiation and a second process gas comprising $O_2$ or $H_2O$.

13. The method according to claim 1, wherein the providing comprises:
depositing a strained Ge-containing layer on the substrate; and
forming a Si-containing layer on the strained Ge-containing layer, wherein one or both of the depositing and forming is performed in the vacuum processing tool.

14. The method according to claim 1, further comprising forming a gate electrode layer on the formed Si-containing dielectric layer, the gate electrode layer comprising poly Si, W, WN, WSix, Al, Mo, Ta, TaN, TaSiN, HfN, HfSi, HfSiN, Ti, TiN, TiSiN, Mo, MoN, Re, Pt, or Ru.

15. The method according to claim 1, further comprising:
forming a high-k dielectric layer on the formed Si-containing dielectric layer, wherein the high-k dielectric layer comprises $Ta_2O_5$, $TiO_2$, $ZrO_2$, $Al_2O_3$, $Y2O_3$, $HfSiO_x$, $HfO_2$, $ZrSiO_x$, $TaSiO_x$, $SrO_x$, $SrSiO_x$, $LaO_x$, $LaSiO_x$, $YO_x$, or $YSiO_x$, or combinations of two or more thereof; and
forming a gate electrode layer on the high-k dielectric layer, wherein the gate electrode layer comprises poly Si, W, WN, WSix, Al, Mo, Ta, TaN, TaSiN, HfN, HfSi, HfSiN, Ti, TiN, TiSiN, Mo, MoN, Re, Pt, or Ru.

16. The method according to claim 1, wherein said exposing comprises oxidizing only a portion of the Si-containing layer.

17. A method of forming a MOSFET device, comprising:
providing a substrate in a process chamber of a vacuum processing tool, the process chamber being pressure-controlled to induce a vacuum therein;
depositing a strained Ge-containing channel region on the substrate;
forming a Si layer on the strained Ge-containing channel region;
introducing a process gas through a nozzle into the process chamber;
exposing the process gas to ultra-violet radiation to form oxidation radicals by dissociating the process gas, the ultra-violet radiation being radiated into a region between the nozzle and the substrate by a UV source located outside the vacuum; and
exposing the Si layer to the oxygen radicals to form a $SiO_2$ gate dielectric layer while minimizing oxidation and strain relaxation in the underlying strained Ge-containing layer,
wherein substantially no ions are formed in the processing tool during exposure to the ultra-violet radiation.

18. The method according to claim 1, wherein in the exposing, the ultra-violet radiation is radiated through a processing chamber window located between the nozzle and the substrate.

* * * * *